(12) United States Patent
Appaswamy et al.

(10) Patent No.: US 12,166,077 B2
(45) Date of Patent: Dec. 10, 2024

(54) REPEATED EMITTER DESIGN FOR ACHIEVING SCALABLE LATERAL PNP BEHAVIOR

(71) Applicant: TEXAS INSTRUMENTS INCORPORATED, Dallas, TX (US)

(72) Inventors: Aravind Appaswamy, Plano, TX (US); Jofin Joseph Vadakkeparasseril, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/707,170

(22) Filed: Mar. 29, 2022

(65) Prior Publication Data
US 2022/0352317 A1   Nov. 3, 2022

Related U.S. Application Data

(60) Provisional application No. 63/181,329, filed on Apr. 29, 2021.

(51) Int. Cl.
| | | |
|---|---|---|
| *H01L 29/08* | (2006.01) | |
| *H01L 29/423* | (2006.01) | |
| *H01L 29/66* | (2006.01) | |
| *H01L 29/735* | (2006.01) | |
| *H01L 29/10* | (2006.01) | |

(52) U.S. Cl.
CPC ...... *H01L 29/0808* (2013.01); *H01L 29/0821* (2013.01); *H01L 29/42304* (2013.01); *H01L 29/6625* (2013.01); *H01L 29/735* (2013.01); *H01L 29/1008* (2013.01)

(58) Field of Classification Search
CPC ............ H01L 29/0808; H01L 29/0821; H01L 29/42304; H01L 29/6625; H01L 29/735; H01L 29/1008; H01L 29/0692; H01L 29/402
See application file for complete search history.

(56) References Cited

U.S. PATENT DOCUMENTS

| | | | |
|---|---|---|---|
| 4,417,265 A | 11/1983 | Murkland et al. | |
| 4,596,976 A | 6/1986 | Mangelsdorf et al. | |
| 6,034,413 A | 3/2000 | Hastings et al. | |
| 2004/0089877 A1 | 5/2004 | Zheng et al. | |
| 2007/0205487 A1 | 9/2007 | Ikeda | |
| 2013/0119508 A1* | 5/2013 | Camillo-Castillo | H01L 29/1008 257/E29.174 |
| 2016/0133731 A1* | 5/2016 | Song | H01L 29/0808 257/579 |
| 2020/0105900 A1* | 4/2020 | Pan | H01L 29/1004 |

OTHER PUBLICATIONS

PCT International Search Report, T91915WO, PCT/US2022/025262, filed Apr. 19, 2022.

* cited by examiner

*Primary Examiner* — Syed I Gheyas
(74) *Attorney, Agent, or Firm* — Yudong Kim; Frank D. Cimino

(57) ABSTRACT

A semiconductor device is described herein. The semiconductor device includes a substrate and a collector region in the substrate. The semiconductor device also includes a plurality of emitter regions in the substrate, each of the plurality emitter regions separate from each other, wherein the plurality of emitter regions is disposed in an area bounded by the collector region.

30 Claims, 8 Drawing Sheets

REPEATED EMITTER DESIGN FOR ACHIEVING SCALABLE LATERAL PNP BEHAVIOR

CROSS-REFERENCE TO RELATED APPLICATIONS

This application claims the benefit of priority under 35 U.S.C. § 119 (e) of U.S. Provisional Application No. 63/181,329 (Texas Instruments docket number TI-91915US01), filed Apr. 29, 2021, which is hereby incorporated by reference in its entirety.

TECHNICAL FIELDS

Examples of the present disclosure generally relate to bipolar transistors and, in particular, to manufacturing bipolar transistors.

BACKGROUND

Bipolar transistors are commonly used in semiconductor devices, especially for high-speed operation and large drive current applications. The bipolar transistor is formed by a pair of P-N junctions, including an emitter-base junction and a collector-base junction. An NPN bipolar junction transistor has a thin region of p-type material providing the base region between two regions of n-type material providing the emitter and collector regions. A PNP bipolar junction transistor has a thin region of n-type material providing the base region between two regions of p-type material constituting the emitter and collector regions. The movement of electrical charge carriers which produces electrical current flow between the collector region and the emitter region is controlled by an applied voltage across the emitter-base junction.

A bipolar transistor 100 is shown in FIG. 1. The bipolar transistor 100 includes an n-type buried layer (NBL) 102 formed over a substrate 101. The bipolar transistor 100 also includes an epitaxial layer 104 grown over the NBL 102. The collector region 120 of the bipolar transistor 100 is a doped region of one conductivity type in epitaxial layer 104, and the base contact region 118 is formed by doped regions of the opposite conductivity type that that of the collector region 120. The base region can be formed by doped (e.g., n-type) regions of the epitaxial layer 104 disposed between the emitter region 116 and the collector region 120, and the base contact region 118 is connected to the base region. The emitter region 116 is a doped region of the same conductivity type as the collector region 120 and is disposed adjacent to the collector region 120. The bipolar transistor 100 also includes deep trenches 128, 130 to encircle the transistor 100 and isolate the bipolar transistor 100.

SUMMARY

This Summary is provided to comply with 37 C.F.R. § 1.73, requiring a summary of the invention briefly indicating the nature and substance of the invention. It is submitted with the understanding that it will not be used to interpret or limit the scope or meaning of the claims.

According to some examples, a semiconductor device includes a substrate, a collector region in the substrate, and a plurality of emitter regions in the substrate. Each of the plurality emitter regions are separate from each other, and the plurality of emitter regions is disposed in an area bounded by the collector region.

According to some examples, a method for manufacturing a semiconductor device is described. The method includes forming a collector region in an epitaxial layer of a semiconductor substrate. The method includes forming a plurality of emitter regions in the epitaxial layer of the semiconductor substrate. The plurality of emitter regions are disposed in an area bounded by the collector region.

According to some examples, a bipolar transistor is described. The bipolar transistor includes a collector region; and a first emitter region and a second emitter region. The first emitter region and second emitter region are disposed on a semiconductor substrate in a ring-shaped area formed by the collector region.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
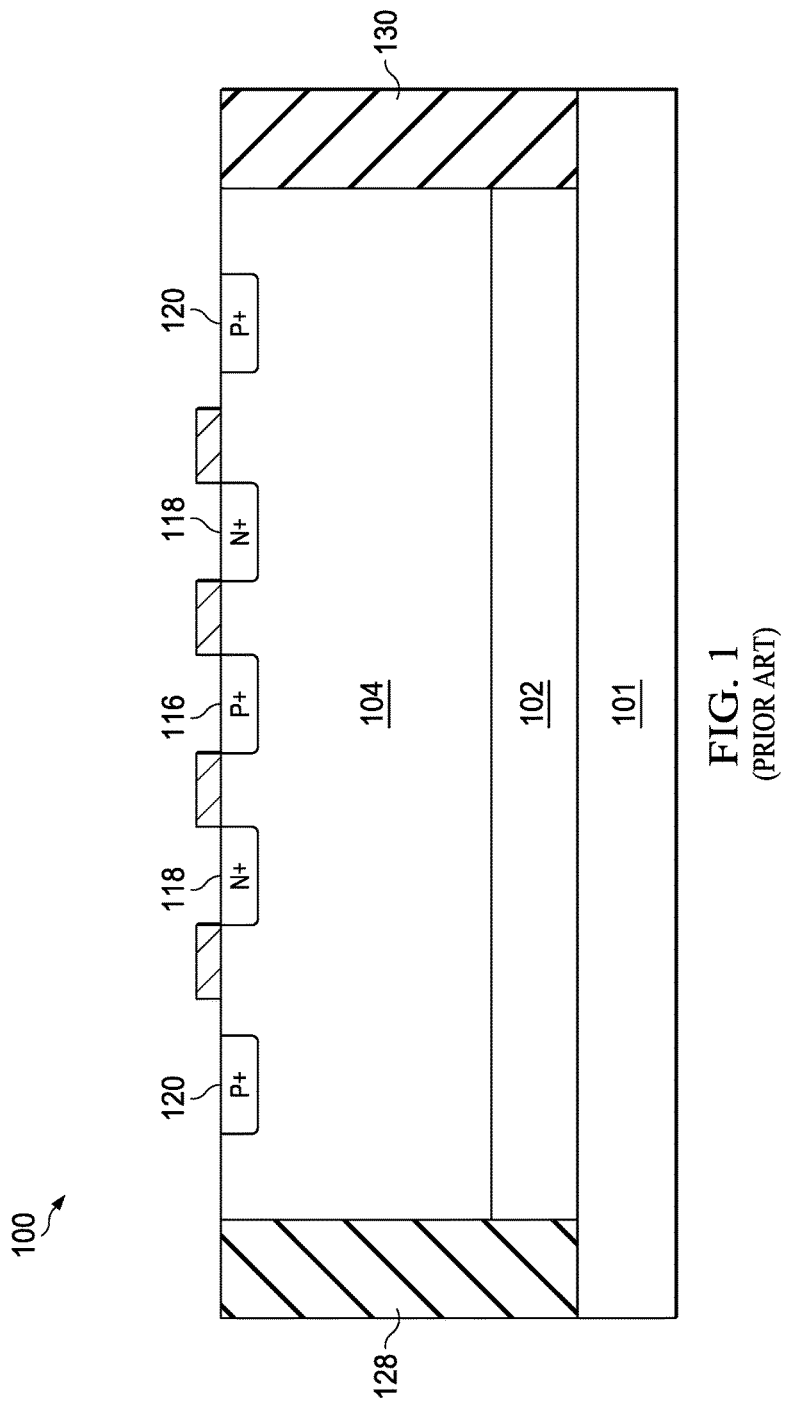
FIG. 1 is a cross-sectional diagram of a bipolar transistor.

The present invention is described with reference to the attached figures, wherein Ike reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Vertical bipolar transistors can be designed to handle higher current by increasing the emitter length and/or the number of groups of emitter regions (called "fingers"), However, lateral bipolar transistors are often constructed with circular and/or small square emitters to maximize the emitter perimeter to emitter area ratio. Circular and/or small square emitters maximize the collector current, which is proportional to the emitter perimeter, vis-à-vis the base current, which has a component proportional to the emitter area. Because of the need to maximize perimeter to area ratios, the emitter regions of lateral bipolar transistors cannot be simply scaled to achieve larger current handling capabilities.

The need to maintain emitter perimeter to area ratio to maintain bipolar transistor performance often necessitates arraying a large array of repeated units of lateral bipolar transistors to drive large currents, which consumes large silicon area. Additionally, multiple lateral bipolar transistors impact the cost of the device.

The area penalty of lateral bipolar unit repetition can be mitigated by integrating the emitter regions in a collector island region. For example, the collector regions can surround each emitter region. While integrating the emitters in the collector island region improves the area density, this combination of the emitters and the collector island region still involves significant area penalty since each emitter region is separated from every other emitter region by the required spacing to each collector region. For high voltage devices, this spacing of the combination of the emitters and the collector island region can be of the order of 10 μm, resulting in a minimum emitter to emitter spacing of 20 μm.

Examples of the present disclosure involve retaining the circular emitter layout of the lateral bipolar transistors to maximize the gain. Examples of the present disclosure involve including multiple emitters associated with a collector region in lateral bipolar transistors to maintain the total emitter perimeter to area ratio. For example, emitters are repeated in a rectangular collector ring to minimize the loss of current gain with larger emitter area. The decrease in current gain with multiple emitter regions is 30-40% less than the other solutions. Also, the collector does not surround every individual emitter allowing the emitters to be spaced close together and reducing the silicon area penalty. The multiple emitters are formed in an area bounded by the collector region with no portion of the collector region extending between the multiple emitters for that collector region.

Figure 2:
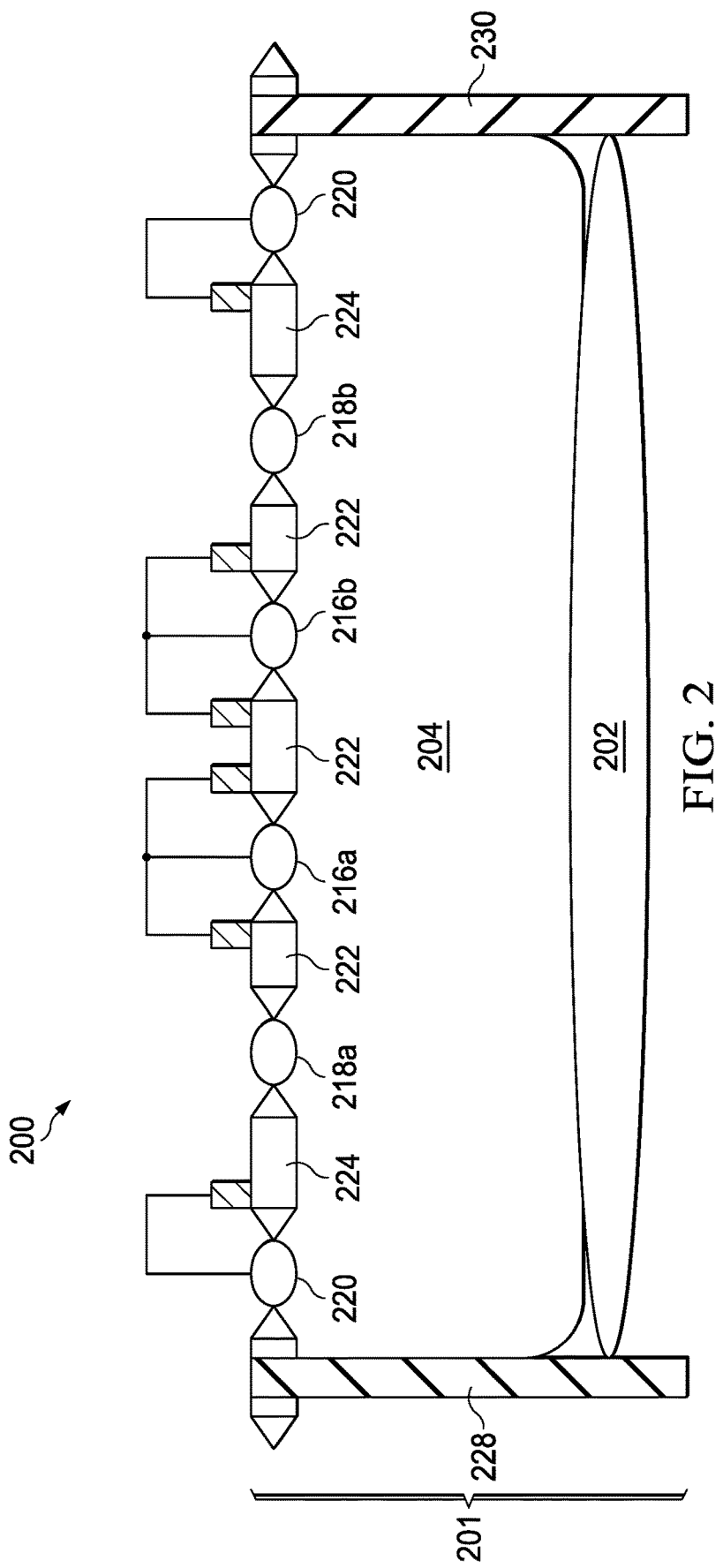
FIG. 2 is a cross-sectional diagram of a bipolar transistor having multiple emitter regions, according to some examples.

FIG. 2 shows an example cross-sectional view of an integrated circuit 200 including a bipolar transistor 201 according to an embodiment. Bipolar transistor 201 is developed on a substrate (not illustrated). In some examples, the substrate may be formed using silicon. The substrate may be doped with p-type dopants (e.g., group III elements of the periodic table).

In some examples, the bipolar transistor 201 includes a buried layer 202. FIG. 2 illustrates an n-type buried layer (NBL) 202. The NBL 202 may be formed by implanting n-type dopants in the substrate. The NBL 202 isolates active circuitry of the bipolar transistor 201 from the underlying substrate, effectively eliminating parasitic nonlinear junction capacitances to the substrate and reducing collector-to-substrate capacitances. The doping concentration of the NBL 202 can have a range of $1e^{17}$ to $1e^{19}$ atoms/cm$^3$, for example, about $5e^{18}$ atoms/cm$^3$. While the example bipolar transistor 201 includes an NBL 202, other example bipolar transistors as described herein can include a p-type buried layer.

The bipolar transistor 201 includes an epitaxial layer 204. The epitaxial layer 204 can be formed on the NBL 202 and, in some cases, formed in direct contact with NBL 202. The epitaxial layer 204 includes a top side and a bottom side. The epitaxial layer 204 is deposited, defined, and doped with an impurity of the conductivity type matching the base contact regions 218 disposed on top of the epitaxial layer 204. The doping concentration of the epitaxial layer can have a range of $5e^{14}$ to $5e^{16}$ atoms/cm$^3$, for example, $1e^{15}$ atoms/cm$^3$. In some examples, the substrate of the bipolar transistor 201 can include the epitaxial layer 204 and the NBL 202.

The bipolar transistor 201 includes a plurality of emitter regions 216a, 216b (collectively emitter regions 216) formed in the top side of the epitaxial layer 204. Each of the emitter regions 216 extend downward into the epitaxial layer 204 to a particular depth (not illustrated) and each of the emitter regions 216 are separate and discrete. Each of the emitter regions 216 can have their own doping concentration, and in some examples, can share the same doping concentrations. The doping concentration of the emitter regions 216 can have a range of $1e^{17}$ to $1e^{20}$ atoms/cm$^3$, for example, $1e^{19}$ atoms/cm$^3$. Each of the emitter regions 216 abuts the top side of the epitaxial layer 204 of the bipolar transistor 201. The emitter regions 216 can be have a variety of shapes, including square, rectangular, and/or circular. The bipolar transistor 201 can include any combination of two or more emitter regions 216 of any shape (square, rectangular, and/or circular) positioned to maximize the total perimeter of the emitters exposed to the corresponding perimeter of the collector region 220. Each of the emitter regions 216 may be surrounded by and shorted to a poly field plate 222, which increases the breakdown voltage between the emitter regions 216 and the base region 218. Similarly, the collector region 220 may be shorted to a poly field plate 224, which increases the breakdown voltage between the collector region 220 and the base region 218. While not shown in FIG. 2, the collector region 220 surrounds the emitter regions 216. FIG. 2 illustrates a cross-section of the collector region 220 present only at the left and right side of the emitter regions 216. However, as illustrated in the top view of FIG. 3, the collector region 220 surrounds the emitter regions 216 and can enable placement of the emitter regions 216 in a single row. The single row placement of the emitter regions 216 allows for each of the emitter regions 216 to face a portion of the collector region, thus enabling current conduction between the emitter and the collector.

By way of example, the bipolar transistor 201 of FIG. 2 includes two emitter regions 216: a first emitter regions 216a and a second emitter region 216b. However, the bipolar transistor 201 may include any number of emitter regions 216 according to examples described herein.

In the example of FIG. 2, the first emitter region 216a includes a first lateral side spaced from and facing the first base contact region 218a as well as an opposite second lateral side (on the right in FIG. 2) spaced from and facing the second emitter region 216b. Similarly, the second emitter region 216b includes a first lateral side spaced from and facing the second lateral side of the first emitter region 216a as well as an opposite second lateral side (on the right in FIG. 2) spaced from and facing a second base contact region 218b. Any additional emitter regions can be disposed between the first emitter region 216a and the second emitter region 216b. For example, a third emitter region can be disposed adjacent to both the first emitter region 216a and the second emitter region 216b: the third emitter region is spaced from and facing the second lateral side of the first emitter region 216a and is spaced from and facing the first lateral side of the second emitter region 216b. In some examples, the emitter regions 216 may be arranged in a row such that each emitter region is adjacent to another emitter region. By arranging the emitter regions 216 in a row, more of the emitter regions 216 are exposed to the collector region 220. Furthermore, multiple emitter regions 216 inside the perimeter of the same collector region 220 maintains the advantage of a larger emitter perimeter to emitter active area ratio. Multiple emitter regions 216 increases the total combined perimeter of the emitters within a given collector region 220 versus a single emitter perimeter of the same total area. This provides a higher ratio of total perimeter length for the emitter regions 216 (i.e., the perimeter length of emitter region 216a+the perimeter length of emitter region 216b+ . . . ) within a given collector region 220 to emitter area within the given collector region 220. A higher ratio of emitter perimeter to emitter area results in higher gain.

In some examples, base contact regions 218a, 218b (collectively base contact regions 218) are formed in the epitaxial layer 204 of the bipolar transistor 201. The base contact regions 218 extend downward into the epitaxial layer 204 from the top surface of the epitaxial layer 204. The doping concentration of the base contact regions 218 can have a range about $1e^{19}$ to $1e^{20}$ atoms/cm$^3$, for example, $1e^{19}$ atoms/cm$^3$. In some examples, the base contact regions 218 have a doping concentration different from that of the epitaxial layer 204. For example, the base contact regions 218 have a doping concentration greater than the doping concentration of the epitaxial layer 204. As mentioned, the base contact region 218 is disposed adjacent to the emitter regions on the top surface of the epitaxial layer 204.

The bipolar transistor 201 further includes a collector region 220. The collector region 220 extends downward in the top surface of the epitaxial layer 204 of the substrate. The multiple emitter regions are bounded by collector region 220. The lateral bipolar transistor 201 allows a top side collector contact. In some embodiments, the collector region 220 forms a ring on the epitaxial layer 204. The emitter regions 216 and the collector region 220 can have the same doping conductivity type and opposite to that of the epitaxial layer 204 and base contact regions 218. The doping concentration of the collector region 220 can have a range of $1e^{17}$ to $1e^{20}$ atoms/cm$^3$, for example, $1e^{19}$ atoms/cm$^3$.

As illustrated in FIG. 2, the base contact regions 218 are disposed adjacent to the emitter regions 216 and are spaced from and facing the collector region 220. However, in some examples such as FIG. 3, an additional base contact region 318 may be provided outside the collector region 220, which is then contacted by back end of line (BEOL) metallization. This favorably impacts the device performance trading off some silicon area. The base contact region 218 in between the emitter region 216 and the collector region 220 is retained here to prevent parasitic channels forming between the emitter region 216 and the collector region 220. The bipolar transistor can also include an uncontacted base region (such as the uncontacted base region 322 disposed between the emitter regions 316 and the collector region 320 of FIG. 3). In some examples, the emitter regions 216 are spaced 2-5 μm (for example, 3 μm) away from each other; the spacing from an emitter region to the collector region 220 is about 5-12 μm (for example, 7.5 μm); and the spacing from an emitter region to a base contact region 218 is about 2-5 μm (for example, 3.5 μm).

In some examples, the bipolar transistor 201 includes deep trench layers 228 and 230. The deep trench layers 228, 230 are formed to encircle the bipolar transistor 201 and can isolate the bipolar transistor 201 from other semiconductor devices. The deep trenches 228, 230 may also be used to contact the doped (e.g., p-type) substrate underneath the NBL 202. In some examples, the deep trench layers 228, 230 form a ring on the epitaxial layer 204 and is disposed adjacent to the collector region 220. The deep trench layers 228, 230 extend from the top of the die to below the NBL 202.

In some examples, instead of deep trench layers 228, 230 as illustrated in FIG. 2, the bipolar transistor 201 includes p-type isolation (PISO) layer and/or p-type buried layer (PBL) implants (not illustrated) when the epitaxial layer 204 is n-type. Accordingly, the implants can replace the deep trench layers 228 and 230 and can form a ring on the epitaxial layer 204 to encircle the bipolar transistor 201. The implants extend from the surface of the epitaxial layer 204 down to the NBL 202. The implants can isolate the epitaxial layer 204 from other portions of the substrate.

In some examples, instead of a PNP bipolar transistor as illustrated in FIG. 2, NPN bipolar transistors can also include multiple emitter regions disposed in an area defined by the collector region. In such examples, the structure and function of the NPN bipolar transistor is similar to bipolar transistor 201 except that in the NPN bipolar transistor, the dopants are reverse to provide a NPN transistor cell structure. As stated herein above, functional aspects of NPN bipolar transistors are similar to the bipolar transistor 201 with reverse dopant and reverse polarities.

In some examples, where the bipolar transistor 201 is a lateral NPN transistor with a p-type epitaxial layer, the bipolar transistor 201 includes deep n-type wells. The deep n-type well touches the implanted NBL 202 and extends to the top of the die providing a top contact to the implanted NBL 202. These deep n-type wells may be disposed adjacent to the deep trench layers 228, 230, and may also extend from the top of the die to the NBL 202.

Figure 3:
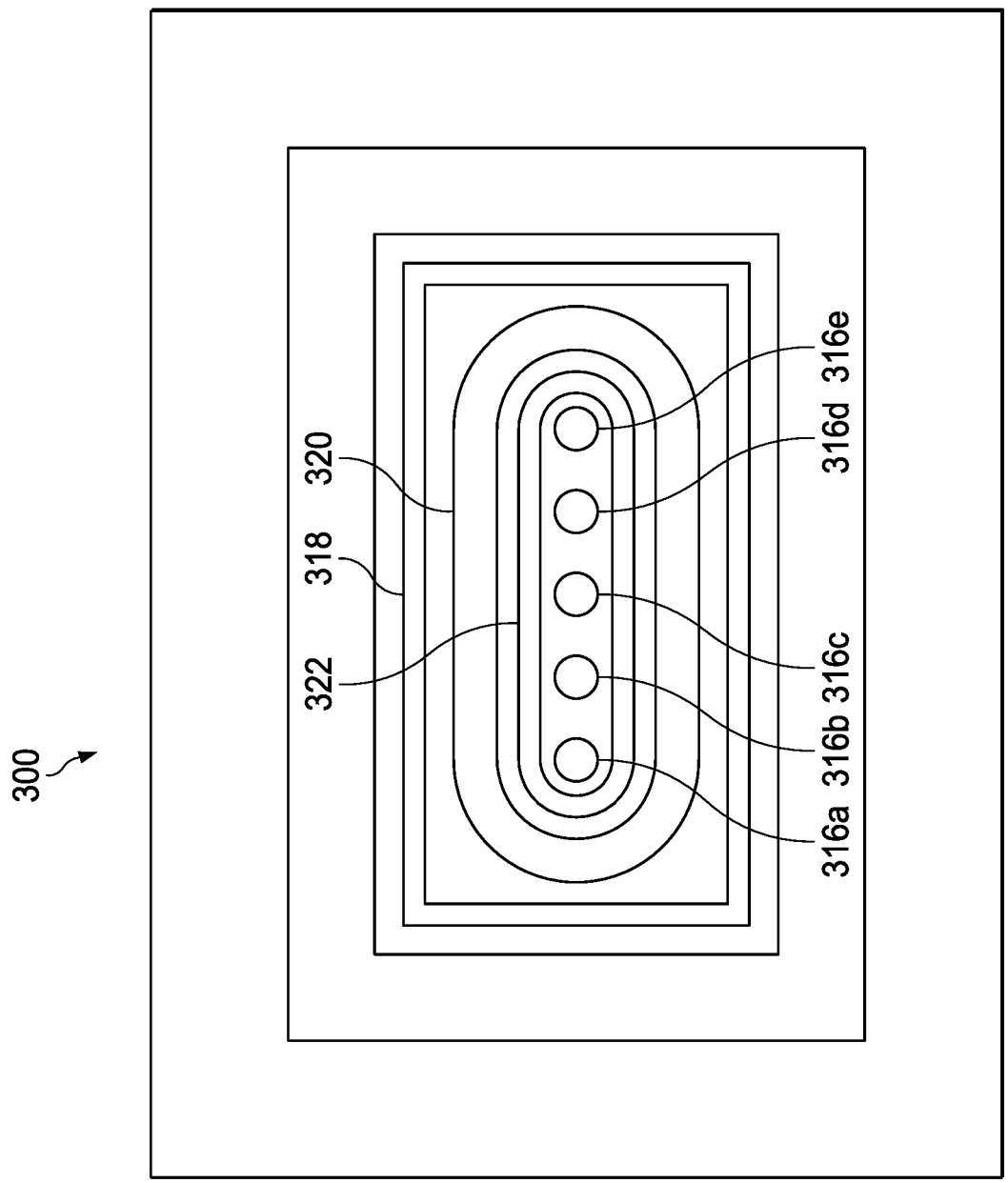
FIG. 3 is a top view of a bipolar transistor having multiple emitter regions, according to some examples.

FIG. 3 is a top view of a bipolar transistor 300 having multiple emitter regions, according to some examples. The bipolar transistor 300 includes a base contact region 318 disposed around the collector region 320, and the collector region 320 in turn is disposed around the multiple emitter regions 316a, 316b, 316c, 316d, 316e (collectively emitter regions 316). Accordingly, the collector region 320 is disposed between the emitter regions 316 and the base contact regions 318. As illustrated, in some examples, the collector region 320 form a ring around the emitter regions 316 and the base contact region 318 form a rectangle around the ring-shaped collector region 320. In some examples, the collector region 320 forms a rectangle around the emitter regions 316. The collector region 320 includes a first side and a second side that are disposed on distal and proximal sides of the emitter regions. For example, the first side of the collector region 320 is adjacent to the distal side of each of the emitter regions 316, and the second side of the collector region 320 is adjacent to the proximal side of each of the emitter regions 316. Correspondingly, the base contact region 318 includes a first side and a second side. The first side of the base contact region 318 is disposed adjacent to the first side of the collector region 320 and the second side of the base contact region 318 is disposed opposite to the first side of the base contact region 318. In some examples, as illustrated, the bipolar transistor 300 can include an uncontacted base region 322 disposed between the emitter regions 316 and the collector region 320, and the uncontacted base region 322 can have the same potential as the base contact region 318.

The collector region 320 surrounding the emitter regions 316 increases the inner perimeter of the collector region 320 exposed to the perimeter of the emitter regions 316. Exposing more of the inner perimeter of the collector region 320 to the perimeter of the emitter regions 316 ensures the proportionality of collector current to emitter region perimeter.

Figure 4:
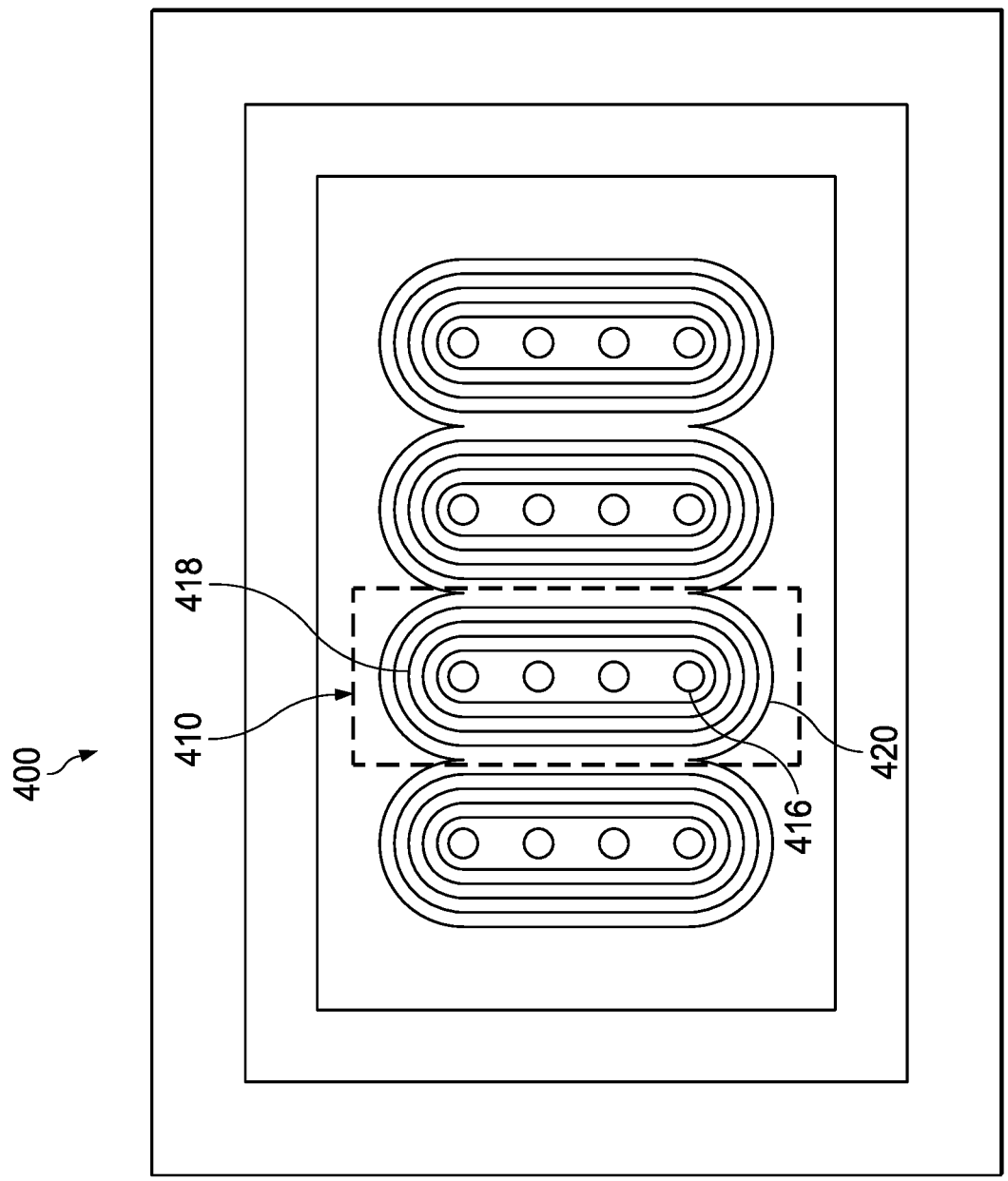
FIG. 4 is a top view of a bipolar transistor having multiple emitter regions, according to some examples.

FIG. 4 is a top view of a bipolar transistor having multiple emitter regions, according to some examples. In some examples, the bipolar transistor 400 can include emitter regions 416, collector region 420, and base contact regions 418 arranged as multiple fingers. Each finger 410, as illustrated in FIG. 4, includes multiple emitter regions 416, a collector region 420, and a base contact region 418. Accordingly, the number of emitter regions 416 of bipolar transistor 400 is more than the number of emitter regions of bipolar transistor 201 of FIG. 2.

The emitter regions 416 of each finger 410 are arranged adjacent to each other and in a column. Each finger 410 includes the base contact region 418 disposed as a ring around the emitter regions 416, and the collector region 420 disposed as a ring around the base contact region 418. The base contact region 418 of each finger 410 includes a first side and a second side that are disposed on distal and proximal sides of the respective emitter regions 416. For example, the first side of the base contact region 418 of each finger 410 is adjacent to the distal side of each of the respective emitter regions 416, and the second side of the base contact region 418 of each finger 410 is adjacent to the proximal side of each of the respective emitter regions 416.

Correspondingly, the collector region 420 of each finger 410 includes a first side and a second side. The first side of the collector region 420 of each finger 410 is disposed adjacent to the first side of the respective base contact region 418 and the collector region 420 is disposed adjacent to the base contact region 418 of an adjacent finger.

Each finger 410 can be arranged in a vertical orientation such that the emitter regions 416 form a column of emitter regions 416. Additionally, the collector region 420 of each finger 410 can be shared with each other. For example, the collector region 420 is shared between adjacent fingers 410. The bipolar transistor 400 includes four fingers 410 but can include any number of fingers 410. The use of multiple fingers with multiple emitter regions 416 enables high current products (e.g., low dropout regulators).

Figure 5:
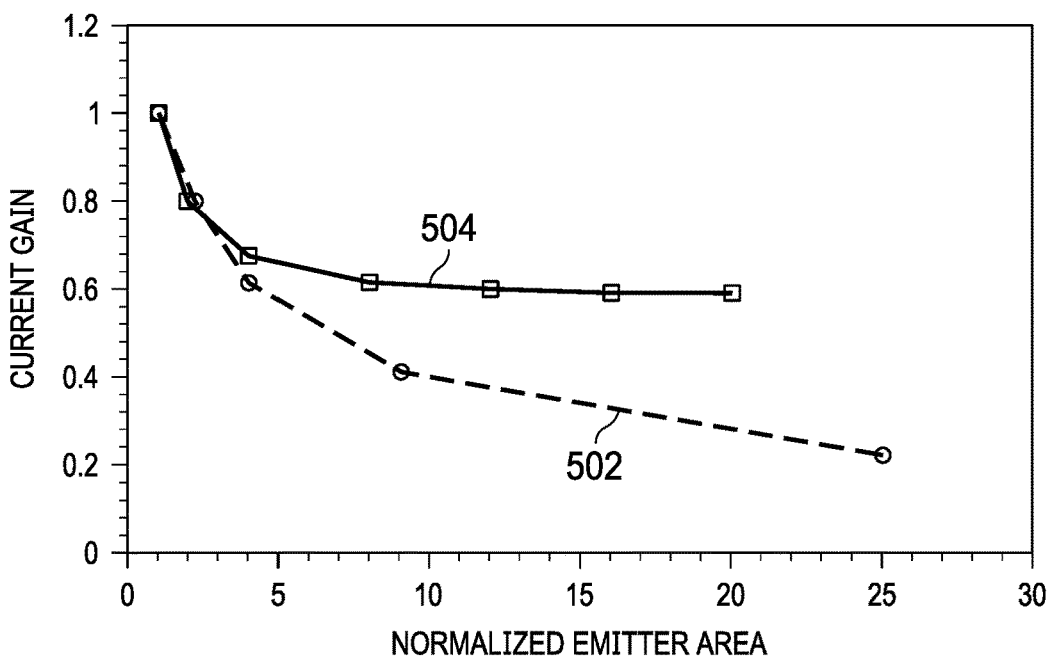
FIG. 5 is a graph illustrating the change in the current gain as a function of the emitter area, according to some examples.

FIG. 5 is a graph illustrating the change in the current gain as a function of the emitter area. The current gain is normalized to the current gain of a transistor with a minimum radius. The graph 500 includes result 502 of a bipolar transistor similar to the bipolar transistor 100 of FIG. 1 and result 504 of a bipolar transistor similar to the bipolar transistor 201 of FIG. 2. Result 502 show the current gain with a single circular emitter region, where the single emitter region increases in radius. Result 504 show the current gain with multiple emitter regions. As illustrated, as the radius of the single emitter region increases, the current gain of result 502 decreases more rapidly compared to the current gain of result 504 corresponding to a bipolar transistor with multiple emitter regions.

Figure 6:
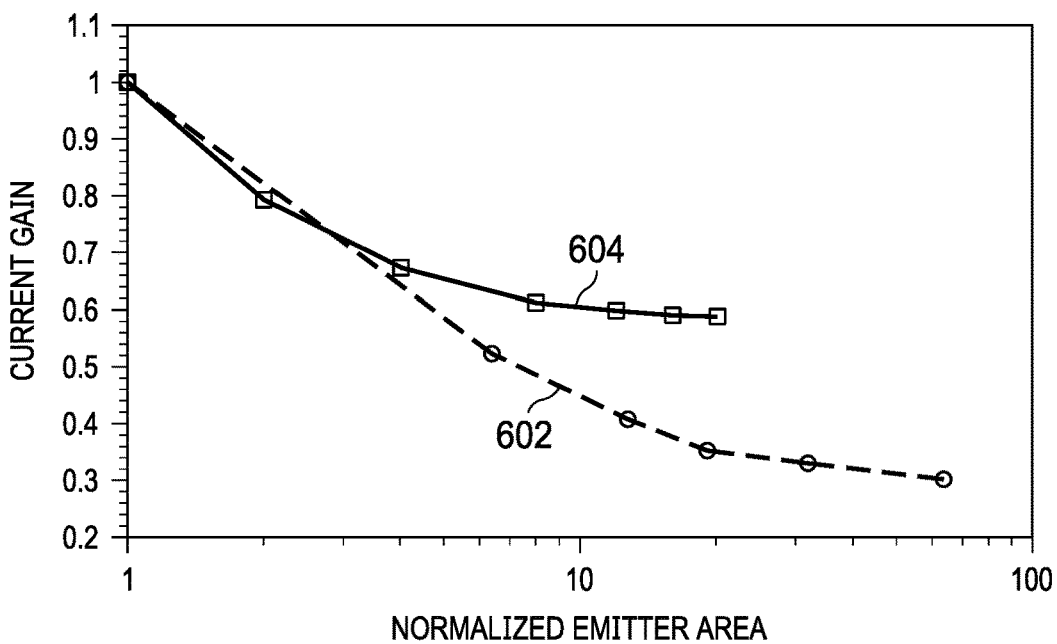
FIG. 6 is a graph illustrating the change in the current gain as a function of the emitter area, according to some examples.

FIG. 6 is a graph illustrating the change in the current gain as a function of the emitter area. The current gain is normalized to the current gain of a transistor with a minimum radius. The graph 600 includes result 602 of a bipolar transistor similar to the bipolar transistor 100 of FIG. 1 and result 604 of a bipolar transistor similar to the bipolar transistor 201 of FIG. 2. Result 602 show the current gain with a single rectangular emitter region, where the single emitter region increases in emitter length. Result 604 show the current gain with multiple emitter regions. As illustrated, as the length of the rectangular emitter region increases, the current gain of result 602 decreases more rapidly compared to the current gain of result 604 corresponding to a bipolar transistor with multiple emitter regions.

Figure 7:
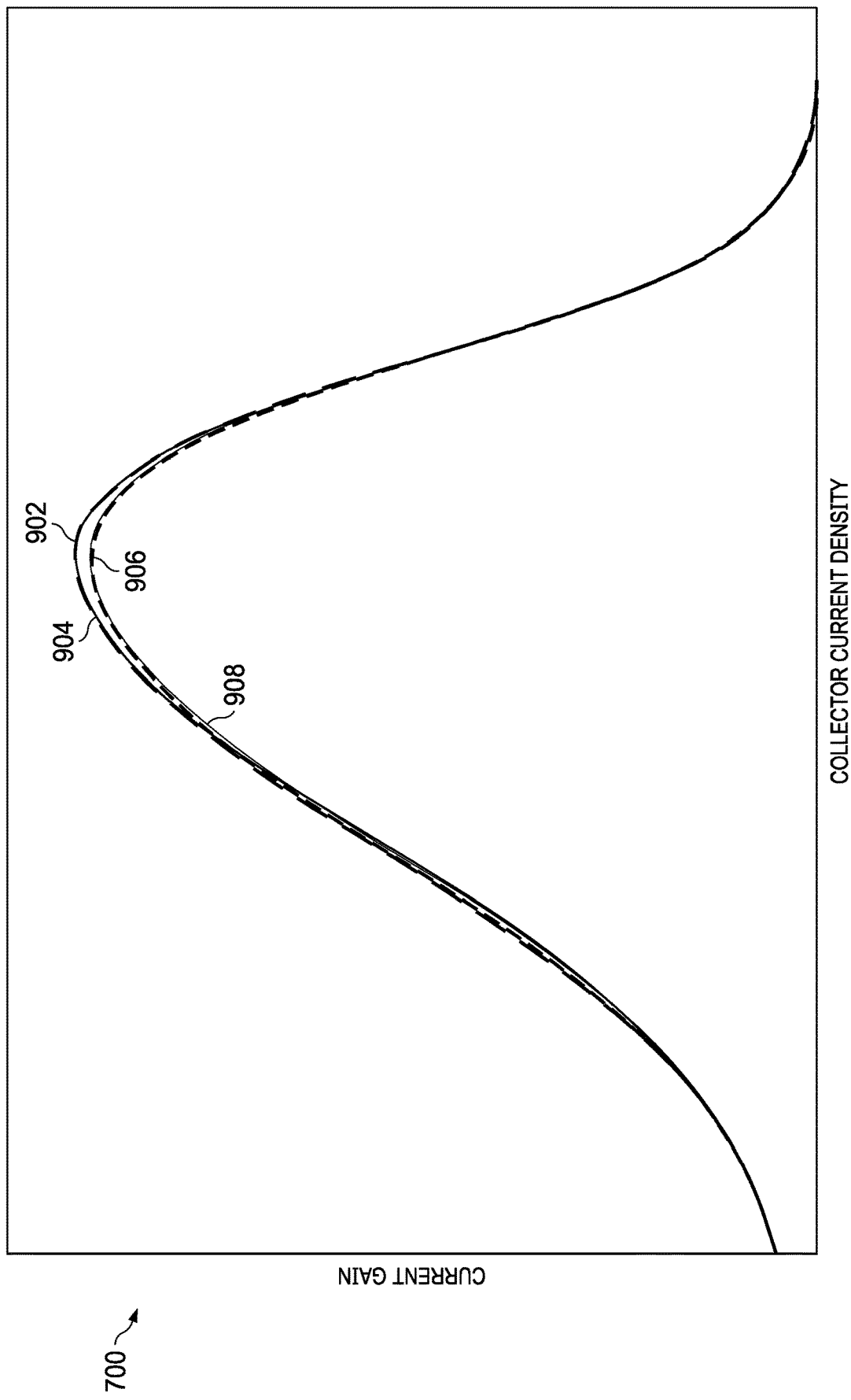
FIG. 7 is a graph illustrating the current gain as a function of collector current density for devices with different number of fingers, according to some examples.

FIG. 7 is a graph illustrating the current gain as a function of collector current density for devices with different number of fingers. The graph 700 includes results 702, 704, 706, and 708 of bipolar transistors, each of the bipolar transistors having different number of fingers with emitter regions. Each of the bipolar transistors have multiple fingers (e.g., fingers 410) and each finger has four emitter regions (e.g., emitter regions 216). Result 702 show the current gain for a bipolar transistor with 2 fingers, each finger with four emitter regions. Result 704 show the current gain for a bipolar transistor with 6 fingers, each finger with four emitter regions. Result 706 show the current gain for a bipolar transistor with 8 fingers, each finger with four emitter regions. Result 708 show the current gain for a bipolar transistor with 12 fingers, each finger with four emitter regions. As illustrated in graph 700, the current gain between bipolar transistors with different number of fingers remains consistent as the number of fingers increases. Accordingly, bipolar transistors having multiple fingers with multiple emitter regions can scale the number of fingers with generally the same current gain.

Figure 8:
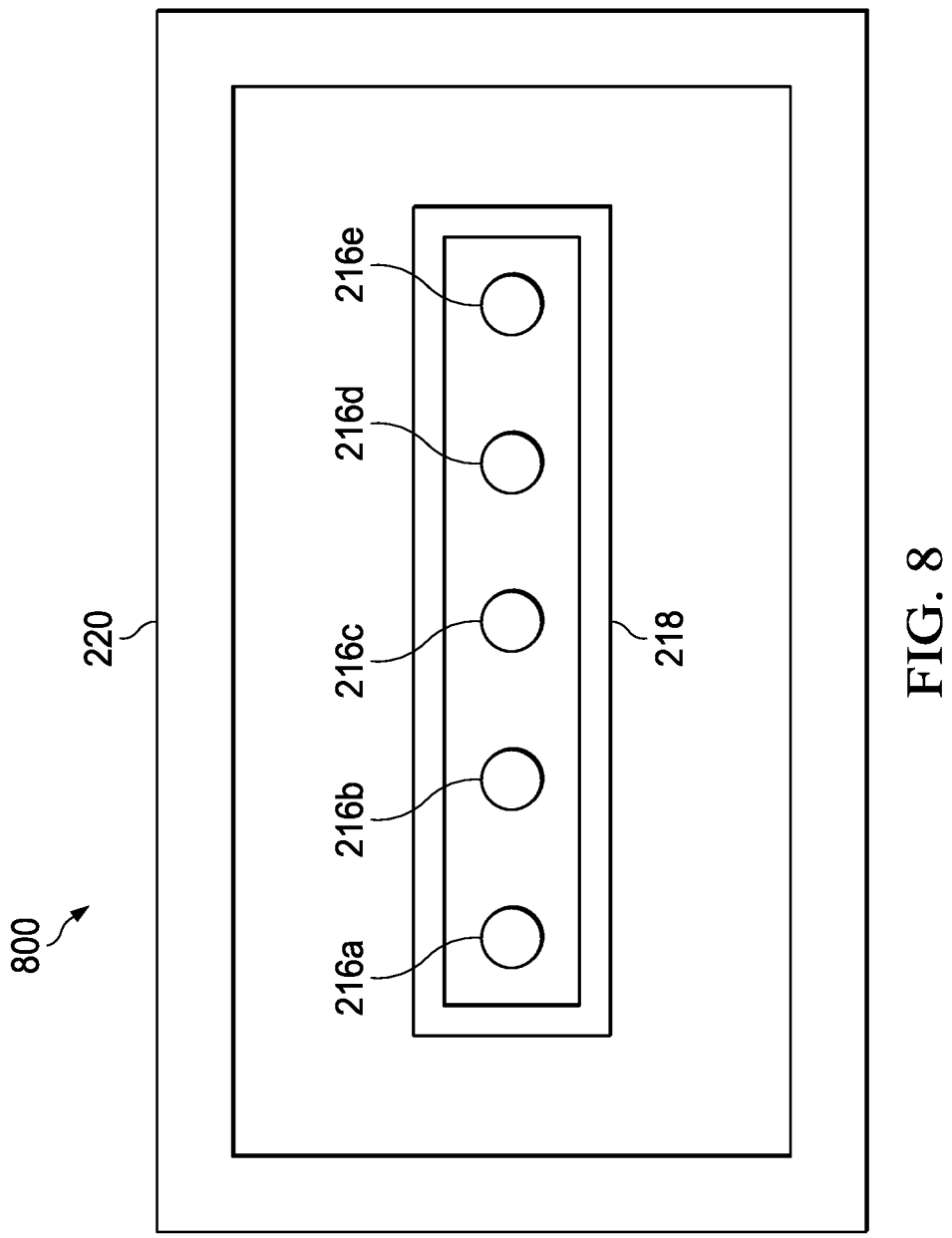
FIG. 8 is a top view diagram of a bipolar transistor having multiple emitter regions, according to some examples.

FIG. 8 is a top view diagram of a bipolar lateral transistor according to some examples. The bipolar transistor 800 includes a collector region 220, the base contact region 218, and the emitter regions 216a, 216b, 216c, 216d, 216d, 216e (collectively emitter regions 216). The collector region 220 of bipolar transistor 800 can be the same collector region 220 of bipolar transistor 201, the base contact region 218 of bipolar transistor 800 can be the same base contact region 218 of bipolar transistor 201; and the emitter regions 216 can be the same emitter regions 216 of bipolar transistor 201. By way of example of FIG. 8, the bipolar transistor 800 includes five emitter regions 216. The emitter regions 216 are arranged adjacent to one another in a row to maximize the perimeter of the emitter regions 216 exposed to the collector region 220.

In some examples, all or some of the emitter regions 216 can be electrically shorted to the same emitter terminal. For example, each of the emitter regions 216 can be connected to the same emitter terminal. In other examples, emitter regions 216a and 216b are both connected to one emitter terminal, and emitter regions 216c, 216d, and 216e are all connected to another emitter terminal. Accordingly, any combination of emitter regions 216 can be electrically shorted to one or more same emitter terminal.

Some emitter regions 216 can be left unconnected or without connections to contacts to achieve the same current gain as the number of contacted emitter regions. For example, emitter regions 216a, 216e can be left uncontacted while emitter regions 216b, 216c, 216d are connected to contacts (i.e., metal contacts). Leaving the emitter regions 216a, 216e at the end of the row of emitter regions 216 uncontacted can result in the same current gain as the current gain with three contacted emitter regions.

Additionally, some emitter regions 216 can also go to different terminals and the remaining emitter regions 216 remain floating to minimize interactions between emitters. For example, emitter regions 216b and 216d can be connected to two different terminals and emitter regions 216a, 216c, and 216e are not connected to any terminals and remain "floating" in order to minimize interactions between emitter regions. Minimizing the interactions between emitter regions can decrease the dependence of gain on the number of emitter regions of the bipolar transistor 800.

Figure 9:
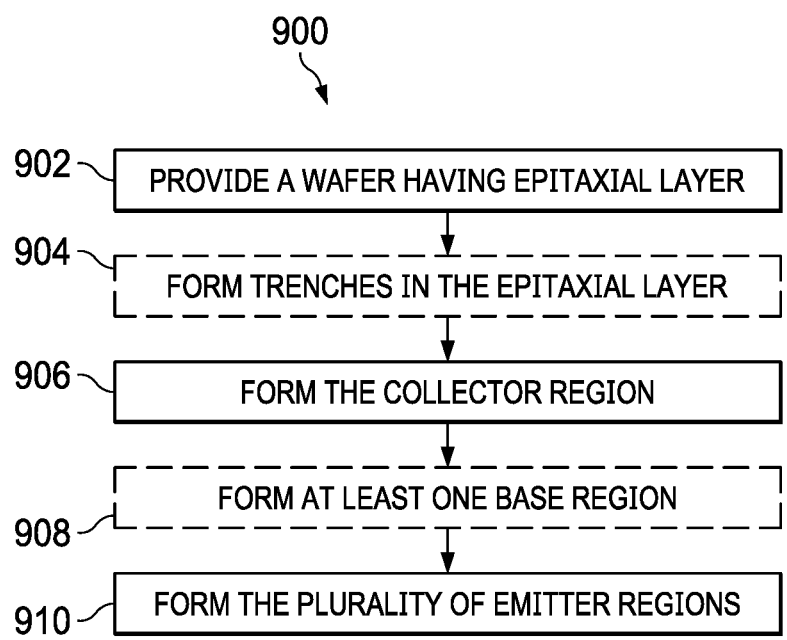
FIG. 9 is a flow diagram illustrating manufacturing a bipolar transistor with multiple emitter regions, according to some examples.

FIG. 9 is a flow diagram of a process of manufacturing a bipolar transistor with multiple emitter regions, according to one example.

Operations 900 begin with step 902 involving providing a wafer having an epitaxial layer and a buried layer. The epitaxial layer of the provided wafer and the buried layer of the provided wafer may be the same epitaxial layer 204 of FIG. 2 and the same NBL 202 of FIG. 2. The epitaxial layer provided with the wafer has a first conductivity type, and the buried layer provided with the wafer can have the same conductivity type as the epitaxial layer. The first conductivity type can be n-type in some examples, and in other examples, the first conductivity type can be p-type.

Operations 900 continue, optionally, at step 904 with forming trenches in the epitaxial layer. The formed trenches in the epitaxial layer can be the trenches 228, 230 of FIG. 2. In some examples, instead of trenches, PISO and/or PBL implants may be used. In some examples, operations 900 further continues with forming deep n-type wells.

Operations 900 continue at step 906 with forming a collector region in the epitaxial layer of the semiconductor device. The collector region formed can be the same collector region 220 of FIG. 2. The collector region formed in the epitaxial layer of the semiconductor device has a second conductivity type, and the second conductivity type is different from the first conductivity type of the epitaxial layer. In some examples, where the first conductivity type of the epitaxial layer is n-type, the second conductivity type of the collector region is p-type. In other examples, where the first conductivity type of the epitaxial layer is p-type, the second conductivity type of the collector region is n-type.

Operations 900 continue, optionally, at step 908, with forming at least one base contact region in the epitaxial layer of the semiconductor device. The formed base contact region can be the same base contact region 218 of FIG. 2. The base contact region formed in the epitaxial layer of the semiconductor device has a conductivity type that matches the first conductivity type of the epitaxial layer. Accordingly, in examples where the first conductivity type of the epitaxial layer is n-type, the conductivity type of the base contact region is also n-type. In examples where the first conductivity type of the epitaxial layer is p-type, the conductivity of the base contact region is also p-type. Forming the base contact region can involve forming the base contact region on a first lateral side of the collector region or forming the base contact region on a second lateral side of the collector region. Accordingly, the base contact region can be disposed inside the area formed by the collector region or outside the are formed by the collector region.

Operations 900 continue with step 908 involving forming the plurality of emitter regions in the epitaxial layer of the semiconductor device. Forming the plurality of emitter regions can occur at the same time as forming the collector region using the same implantation steps, or at different times. As described above, the plurality of emitter regions formed may have a variety of shapes (e.g., circular, square, rectangular and the semiconductor device can have any number of emitter regions. When forming the emitter regions in the epitaxial layer, the emitter regions can be formed in a row so that each emitter region is adjacent to another emitter region without an intervening collector region. In some examples, the emitter regions can be formed in an array of emitter regions with multiple rows and columns. When forming the plurality of emitter regions in the epitaxial layer, the emitter region, the base contact region, and the collector region may be disposed on the epitaxial layer of the bipolar transistor as illustrated in FIG. 2. The emitter regions formed in the epitaxial layer of the semiconductor device each have a second conductivity type, and the second conductivity type is different from the first conductivity type of the epitaxial layer. In some examples, where the first conductivity type of the epitaxial layer is n-type, the second conductivity type of the emitter regions is p-type. In other examples, where the first conductivity type of the epitaxial layer is p-type, the second conductivity type of the emitter regions is n-type.

In some examples, operations 900 can involve manufacturing the bipolar transistors in multiple finger arrangements. When manufacturing the bipolar transistor to include multiple finger arrangements, operations 900 can involve forming multiple collector regions, multiple base contact regions, and multiple sets of emitter regions and arrange a collector region, a base contact region, and a set of emitter regions for each of the finger arrangements. When manufacturing the bipolar transistor with multiple finger arrangements, operations 900 can involve manufacturing the multiple finger arrangements as described above, with reference to FIG. 3. As mentioned, operations 900 can involve forming any number of finger arrangements.

In some examples, operations 900 can involve forming one or more contacts coupled to one or more of the emitter regions, to the collector region, and/or to the base contact region. Forming the one or more contacts coupled to the emitter regions can involve forming one contact that electrically shorts multiple emitter regions. For example, operations 900 can involve forming an emitter terminal that electrically shorts more than one emitter region (e.g., emitter region 216a, 216b, 216c, 216d, and 216e of FIG. 8). Forming the one or more contacts coupled to the emitter regions can also involve forming one or more contacts to emitter regions but leaving some of the emitter regions unconnected. For example, operations 900 can involve forming one or more contacts for emitter regions 216b, 216c 216d of FIG. 8 while leaving emitter regions 216a and 216e unconnected. In some examples, forming one or more contacts coupled to the emitter regions can involve connecting some emitter regions to different contacts and leaving other emitter regions floating. For example, operations 900 can involve forming an emitter contact connected to emitter regions 216b and 216d of FIG. 8 and leaving emitter regions 216a, 216c and 216e of FIG. 10 unconnected to any contacts.

The operations 900 continues with BEOL processing and packaging of the semiconductor device.

Although the exemplary devices described above are configured as n-type transistors, the invention also includes devices that are configured as p-type transistors or combinations of n-type or p-type transistors. One of ordinary skill in the art would understand how to fabricate p-type transistors in accordance with the invention, e.g., by inverting the type of dopants, as compared to that shown in the figures.

The semiconductor substrates may include various elements therein and/or layers thereon. These can include barrier layers, other dielectric layers, device structures, active elements and passive elements including, source regions, drain regions, bit lines, bases, emitters, collectors, conductive lines, conductive vias, etc. Moreover, the invention can be based on a variety of processes including CMOS, BiCMOS and BCD (Bipolar-CMOS-DMOS) technologies.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising." Unless otherwise stated, "about," "approximately," or "substantially" preceding a value means+/−10 percent of the stated value.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the following claims.

What is claimed is:

1. A semiconductor device, comprising:
a substrate;
a collector region in the substrate; and
a plurality of emitter regions in the substrate, each of the plurality of emitter regions separate from each other, wherein the plurality of emitter regions is disposed in an area bounded by the collector region, and wherein at least one emitter region of the plurality of emitter regions is uncoupled from an emitter terminal.

2. The semiconductor device of claim 1, wherein the collector region is shaped to form a ring in the substrate.

3. The semiconductor device of claim 1, wherein the plurality of emitter regions and the collector region are arranged to form a finger arrangement.

4. The semiconductor device of claim 3, wherein each of the plurality of emitter regions is disposed adjacent to another of the plurality of emitter regions in a row.

5. The semiconductor device of claim 1, wherein the collector region comprises a first side disposed adjacent to a first side of each of the plurality of emitter regions and a second side disposed adjacent to a second side of each of the plurality of emitter regions.

6. The semiconductor device of claim 1, wherein the semiconductor device comprises a PNP device and the collector region and each of the plurality of emitter regions comprise p-type doped material.

7. The semiconductor device of claim 1, wherein the semiconductor device comprises an NPN device and the collector region and each of the plurality of emitter regions comprise n-type doped material.

8. The semiconductor device of claim 1, further comprising a base contact region disposed on the substrate and on an opposite side of the collector region from the plurality of emitter regions.

9. The semiconductor device of claim 1, further comprising at least one trench isolating the collector region and the plurality of emitter regions.

10. The semiconductor device of claim 1, further comprising a field plate surrounding the plurality of emitter region.

11. The semiconductor device of claim 1, further comprising a base contact region between the collector region and the plurality of emitter regions.

12. The semiconductor device of claim 1, wherein the substrate comprises a n-type buried layer and an epitaxial layer disposed on the n-type buried layer.

13. The semiconductor device of claim 12, wherein the epitaxial layer comprises n-type doped material.

14. The semiconductor device of claim 13, wherein the epitaxial layer comprises p-type doped material.

15. The semiconductor device of claim 1, further comprising a p-type isolating material and an p-type buried layer.

16. The semiconductor device of claim 1, wherein at least one of the emitter regions comprises a circular shape.

17. The semiconductor device of claim 1, wherein at least one emitter region of the plurality of emitter regions is coupled to an emitter terminal.

18. The semiconductor device of claim 1, wherein at least two emitter regions of the plurality of emitter regions are coupled to a same emitter terminal.

19. A method for manufacturing a semiconductor device, comprising:
forming a collector region in an epitaxial layer of a semiconductor substrate;
forming a plurality of emitter regions in the epitaxial layer of the semiconductor substrate, where the plurality of emitter regions are disposed in an area bounded by the collector region; and
forming an emitter terminal coupled to a first emitter region of the plurality of emitter regions, wherein a second emitter region of the plurality of emitter regions is uncoupled from the emitter terminal.

20. The method of claim 19, further comprising: forming at least one base contact region in the epitaxial layer of the semiconductor substrate, wherein the at least one base contact region is disposed adjacent to at least one of the plurality of emitter regions and adjacent to the collector region.

21. A bipolar transistor, comprising:
a collector region shaped to form a ring; and a first emitter region and a second emitter region, wherein the first emitter region and second emitter region are disposed on a semiconductor substrate in an area inside the ring formed by the collector region, and wherein:

the first emitter region is coupled to an emitter terminal; and the second emitter region is uncoupled from the emitter terminal.

22. A bipolar junction transistor, comprising:

a substrate;

a plurality of emitter regions, each emitter region of the plurality of emitter regions being separate from each other and aligned to a linear direction, wherein at least one emitter region of the plurality of emitter regions is uncoupled from an emitter terminal; and a collector region surrounding the plurality of emitter regions.

23. The bipolar junction transistor of claim 22, wherein:

a first emitter region of the plurality of emitter regions is coupled to a first emitter terminal; and a second emitter region of the plurality of emitter regions is coupled to a second emitter terminal different from the first emitter terminal.

24. The bipolar junction transistor of claim 22, wherein at least one emitter region of the plurality of emitter regions is surrounded by and connected to a field plate.

25. The bipolar junction transistor of claim 24, wherein the field plate includes polysilicon.

26. The bipolar junction transistor of claim 22, wherein the collector region is connected to a field plate.

27. The bipolar junction transistor of claim 26, wherein the field plate includes polysilicon.

28. The bipolar junction transistor of claim 22, further comprising:

a base contact region surrounding the plurality of emitter regions, the base contact region being surrounded by the collector region.

29. The bipolar junction transistor of claim 22, further comprising:

an uncontacted base region surrounding the plurality of emitter regions, the uncontacted base region being surrounded by the collector region.

30. The bipolar junction transistor of claim 29, further comprising:

a base contact region surrounding the collector region.

\* \* \* \* \*